United States Patent
Zawadzki et al.

(10) Patent No.: US 12,339,302 B2
(45) Date of Patent: Jun. 24, 2025

(54) APPARATUS AND METHOD FOR MEASURING ACTIVE ELECTRIC POWER IN AN ELECTRIC CIRCUIT

(71) Applicant: ABB Schweiz AG, Baden (CH)

(72) Inventors: Artur Zawadzki, Cracow (PL); Grzegorz Molinski, Cracow (PL); Piotr Ryba, Humniska (PL)

(73) Assignee: ABB Schweiz AG, Baden (CH)

( * ) Notice: Subject to any disclaimer, the term of this patent is extended or adjusted under 35 U.S.C. 154(b) by 102 days.

(21) Appl. No.: 18/178,678

(22) Filed: Mar. 6, 2023

(65) Prior Publication Data

US 2023/0288460 A1    Sep. 14, 2023

(30) Foreign Application Priority Data

Mar. 8, 2022    (EP) .................................. 22160670

(51) Int. Cl.
*G01R 21/06* (2006.01)
*G01R 21/133* (2006.01)

(52) U.S. Cl.
CPC .......... *G01R 21/06* (2013.01); *G01R 21/133* (2013.01)

(58) Field of Classification Search
CPC ..... G01R 21/06; G01R 21/133; G01R 21/002
USPC ....................................................... 324/114
See application file for complete search history.

(56) References Cited

U.S. PATENT DOCUMENTS

| | | |
|---|---|---|
| 6,377,037 B1 | 4/2002 | Burns |
| 2014/0028282 A1 | 1/2014 | Perry |
| 2014/0152110 A1 * | 6/2014 | Sugimoto ................. H02J 4/00 307/66 |
| 2014/0244191 A1 | 8/2014 | Oka |
| 2016/0072270 A1 | 3/2016 | Rostron |

(Continued)

FOREIGN PATENT DOCUMENTS

| | | |
|---|---|---|
| CN | 102095938 A | 6/2011 |
| EP | 0760935 A1 | 3/1997 |

(Continued)

OTHER PUBLICATIONS

Extended European Search Report for European Application No. 22160670.0, dated Feb. 9, 2022, 8 pages.

(Continued)

*Primary Examiner* — Raul J Rios Russo
(74) *Attorney, Agent, or Firm* — McCarter & English, LLP; Michael M. Gnibus (57) ABSTRACT

Described herein is a measuring apparatus including a first measuring unit operatively coupled to a first measurement point of the electric circuit, said first measuring unit configured to acquire first detection values related to one or more voltages at the first measurement point of said electric circuit; and a plurality of second measuring units operatively coupled to a plurality of second measurement points of said electric circuit, each second measuring unit configured to acquire second detection values related to one or more currents at a corresponding second measurement point of said electric circuit. The first measuring unit and the second measuring units are capable of communicating one with another, in a wired or wireless manner, in order to measure active electric power at said second measurement points. Also described herein is a method for measuring active electric power in an electric circuit.

15 Claims, 5 Drawing Sheets

(56) References Cited

U.S. PATENT DOCUMENTS

| | | | |
|---|---|---|---|
| 2017/0108351 A1* | 4/2017 | Shimizu | H04Q 9/00 |
| 2018/0189203 A1 | 7/2018 | Decaux | |
| 2020/0049759 A1* | 2/2020 | Schleser | G01R 35/00 |
| 2021/0173017 A1* | 6/2021 | Schlarb | G01R 19/2506 |
| 2022/0187347 A1* | 6/2022 | Sargsyan | G01R 15/142 |

FOREIGN PATENT DOCUMENTS

| | | |
|---|---|---|
| EP | 2283371 A1 | 2/2011 |
| EP | 3761046 A1 | 1/2021 |
| WO | 2017143425 A1 | 8/2017 |

OTHER PUBLICATIONS

European Search Report for European Application No. 20181289, dated Nov. 26, 2020, 4 pages.

\* cited by examiner

APPARATUS AND METHOD FOR MEASURING ACTIVE ELECTRIC POWER IN AN ELECTRIC CIRCUIT

CROSS-REFERENCE TO RELATED APPLICATION

This application claims priority to European Patent Application No. 22160670.0, filed Mar. 8, 2022, and titled "APPARATUS AND METHOD FOR MEASURING ACTIVE ELECTRIC POWER IN AN ELECTRIC CIRCUIT", which is hereby incorporated by reference in its entirety.

BACKGROUND

The present disclosure relates to the field of electric power measurements in electric circuits, such as electric power distribution grids, electric power supply systems, electric switchboards, electric cabinets, and the like.

More particularly, the present disclosure relates to a measuring apparatus and method, which allow accurately measuring the active electric power in an electric circuit.

As it is known, energy meters are often used to measure active power in an electric circuit. These measuring devices notoriously ensure a high level of precision but they are generally expensive and bulky, thus being normally inappropriate for use in electric circuits with a huge number of measurement points.

In order to overcome these issues, there have been designed measuring apparatuses employing a central measuring unit and a number of peripheral small measuring units, which can be installed as stand-alone devices or onboard other devices (e.g. switching devices) of an electric circuit.

The central measuring unit measures RMS voltages and currents (and possibly other physical quantities) at a central measurement point of the electric circuit where conductors (phase and neutral conductors) can be easily accessed.

The peripheral measuring units measure RMS currents at peripheral measurement points of the electric circuit and transmit the acquired detection values to the central measuring unit through a communication bus. The central measuring unit then calculates the active electric power flowing through the measurement points of the electric circuit.

Even if they show relevant advantages in terms of flexibility of installation, which makes them particularly adapted for use in electric circuits with many measurement points, currently available measuring apparatuses of this type still show relatively low levels of accuracy in measuring the active electric power flowing through the peripheral measurement points of the electric circuit. This inconvenience is basically due to the circumstance that power measurements are typically based on RMS measurements of voltages and currents, phase-shift measurements (which assume that that voltages and currents have perfectly sinusoidal waveforms) or estimations of the power factor in the electric circuit.

These measuring apparatuses of the state of the art, additionally, require that relatively complex sensing means (especially for carrying the above-mentioned phase-shift measurements) are installed at each peripheral measurement point with a consequent increase of their overall costs.

BRIEF DESCRIPTION

The present disclosure provides an apparatus and method for measuring active electric power in an electric circuit, which allow solving or mitigating the technical problems evidenced above.

The present disclosure also provides a measuring apparatus and method, which are particularly adapted for use in electric circuits having a large number of measurement points and, at the same time, which ensure high levels of accuracy in measuring active power at the various measurement points of an electric circuit.

The present disclosure also provides a measuring apparatus and method, which are relatively easy to install and use in the field and which are relatively inexpensive to implement at industrial level.

These aspects are achieved by a measuring apparatus, according to the following claim 1 and the related dependent claims.

In a general definition, the measuring apparatus, according to the present disclosure, includes:

a first measuring unit operatively coupled to a first measurement point of the electric circuit. Said first measuring unit is configured to acquire first detection values related to one or more voltages at the first measurement point of said electric circuit;

a plurality of second measuring units operatively coupled to a plurality of second measurement points of said electric circuit. Each second measuring unit is configured to acquire second detection values related to one or more currents at a corresponding second measurement point of said electric circuit.

The above-mentioned first measuring unit and second measuring units are capable of communicating one with another, in a wired or wireless manner.

According to the present disclosure, the aforesaid first measuring unit is configured to transmit in a cyclical manner, with a predefined broadcasting frequency and during subsequent measurement intervals, broadcast messages to said second measuring units. Each broadcast message includes first detection values acquired by said first measuring unit.

According to the present disclosure, each second measuring unit is configured to receive, during each measurement interval, a broadcast message transmitted by said first measuring unit and including first detection values acquired by said first measuring unit at an acquisition instant preceding said measurement interval.

According to the present disclosure, each second measuring unit is configured to calculate, during said measurement interval, in response to receiving said broadcast message, third detection values indicative of the active electric power flowing through a corresponding second measurement point of said electric circuit.

According to the present disclosure, each second measuring unit is configured to calculate said third detection values at a calculation instant included in said measurement interval and delayed of a predefined latency time relative to the acquisition instant of the first detection values included in the received broadcast message during said measurement interval.

According to the present disclosure, each second measuring unit is configured to calculate said third detection values based on first detection values received by said second measuring unit up to said calculation instant and based on second detection values acquired by said second measuring unit up to the acquisition instant of the first detection values included in the received broadcast message.

According to the present disclosure, each second measuring unit is configured to calculate the acquisition instant of the first detection values included in the received broadcast message, during said measurement interval based on said calculation instant and said latency time.

Said predefined latency time may have a constant and equal duration for all the second measuring units.

Said predefined latency time may be an integer multiple of the duration time of each measurement interval.

Each second detection unit may be configured to acquire additional detection values related to one or more additional physical quantities at a corresponding second measurement point of said electric circuit.

Each broadcast message may include an address value addressing a second measuring unit, from which a response message is desired.

In this case, each second measuring unit may be configured to transmit, during said measurement interval, in response to receiving said broadcast message, a response message to said first measuring unit, if said measuring unit is addressed by the address value included in the received broadcast message. Said response message includes one or more detection values calculated or detected by said second measuring unit.

Said first measuring unit may include a metering module configured to sense one or more voltages at the first measurement point of said electric circuit, a broadcasting module configured to transmit said broadcast messages to said second measuring units and a control module configured to control the operation of said metering module and said broadcasting module.

The metering module is configured to acquire said first detection values and transmit said first detection values to the broadcasting module.

The broadcasting module is configured to encode, during each measurement interval, said first detection values in a broadcast message and transmit said broadcast message to said second measuring units.

The broadcasting module may be further configured to decode, during each measurement interval, the detection values included in a response message received from a second measuring unit and transmit said detection values to said control module.

The broadcasting module may be configured to interact with the metering module synchronously with the transmission of the broadcast messages. In this case, the metering module transmits the above-mentioned detection values, during each measurement interval in which a broadcast message is transmitted by said broadcasting module.

In a further aspect, the present disclosure relates to an electric power distribution system according to the following claim 9.

In yet a further aspect, the present disclosure relates to a method for measuring active electric power in an electric circuit, according to claim 10 and the related dependent claims.

The method, according to the present disclosure, includes the following steps:
- acquiring first detection values related to one or more voltages at a first measurement point of the electric circuit;
- acquiring second detection values related to one or more currents at a plurality of second measurement points of the electric circuit.

The method, according to the present disclosure, further includes the following steps:
- at said first measurement point, transmitting in a cyclical manner, with a predefined broadcasting frequency and during subsequent measurement intervals, broadcast messages to said second measurement points. Each broadcast message includes first detection values acquired at said first measuring point;
- at each second measurement point, receiving, during each measurement interval, a broadcast message transmitted from said first measuring point and including first detection values acquired at said first measuring point, at an acquisition instant preceding said measurement interval;
- at each second measurement point, calculating, in response to receiving said broadcast message, third detection values indicative of the active electric power flowing through a corresponding second measurement point of said electric circuit.

According to the present disclosure, said third detection values are calculated at a calculation instant included in the measurement interval in which the broadcast message is received. The calculation instant is delayed of a predefined latency time relative to the acquisition instant of the first detection values included in the received broadcast message.

According to the present disclosure, said third detection values are calculated based on first detection values received at said second measuring point up to said calculation instant and based on second detection values acquired at said second measuring point up to the acquisition instant of the first detection values included in the received broadcast message.

According to the present disclosure, the acquisition instant of the first detection values included in the received broadcast message is calculated based on said calculation instant and said latency time.

Said predefined latency time may have a constant and equal duration for all the second measuring points.

Said predefined latency time may be an integer multiple of the duration time of each measurement interval.

The method of the present disclosure may include the step of acquiring, at each second measurement point, additional detection values related to one or more additional physical quantities.

Each broadcast message may include an address value indicative of a second measuring point, from which a response message is desired.

In this case, the method of the present disclosure may include the step of transmitting, at each second measurement point, during said measurement interval, in response to receiving said broadcast message, a response message to said first measuring point, if said second measuring point is indicated by the address value included in said broadcast message. The response message includes one or more detection values calculated or detected at said second measuring point.

Further characteristics and advantages of the present disclosure shall emerge more clearly from the description of embodiments illustrated purely by way of example and without limitation in the attached drawings.

DETAILED DESCRIPTION

Figure 1:
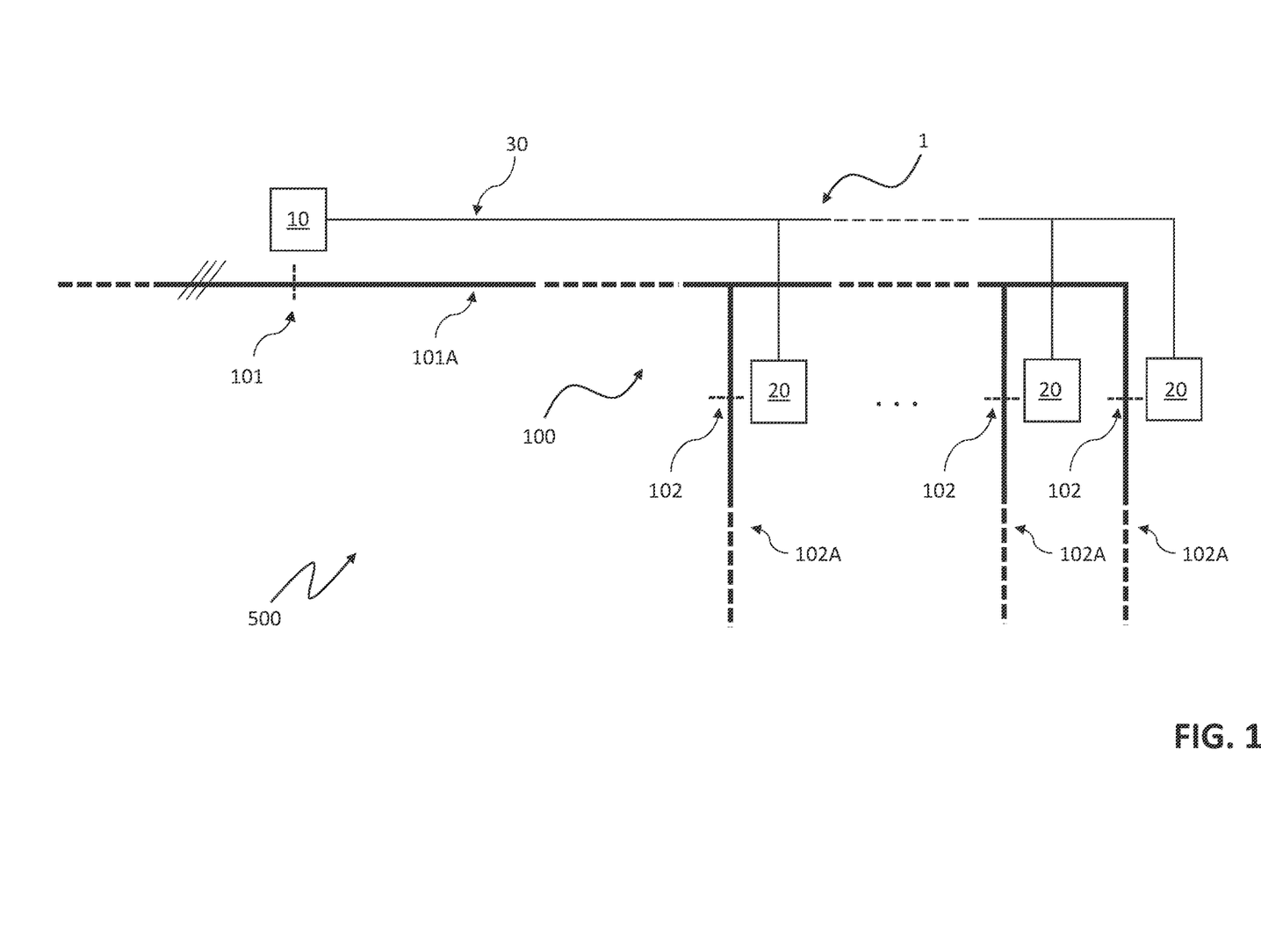
FIG. 1 schematically shows an electric power system including the measuring apparatus, according to the present disclosure.

With reference to the mentioned figures, FIG. 1 schematically shows an electric power system 500 including an electric circuit 100 and a measuring apparatus 1, according to the present disclosure.

The electric circuit 100 may be, for example, an electric power distribution grid, an electric power supply apparatus, an electric switchboard, an electric cabinet, and the like.

The electric circuit 100 may be of the low-voltage or medium-voltage type: therefore, it can operate up to tens of kV, e.g., up to 100 kV AC.

The electric circuit 100 may have a single electric phase or be of the multi-phase type, for example of the three-phase type. In the following, the present disclosure will be discussed with particular reference to an electric circuit 100 having three electric phases for the sake of simplicity only. This choice does not intend to limit the scope of the present disclosure. As it will better emerge from the following description, the measuring apparatus of the present disclosure can be easily adapted for use in single-phase electric circuits or in electric circuits having a different number of electric phases.

According to the present disclosure, the measurement apparatus 1 is operatively coupled to the electric circuit 100 at one or more measurement points 101, 102, more specifically at a first measurement point 101 and at a plurality of second measurement points 102 of the electric circuit.

In principle, the measurement points 101, 102 may be arranged at any position along the electric circuit 100 provided that they have substantially equal voltages (small voltage drops due to cable connections or other reasons are here considered as negligible).

The first measurement point 101 may be arranged at a position of the electric circuit, in which electrical conductors (e.g., phase conductors and possibly the neutral conductor) can be easily accessed by a measuring unit.

Advantageously, the first measurement point 101 is a central measurement point (i.e., located at a central position of the electric circuit) while the second measurement points 102 are peripheral measurement points (i.e., located at peripheral positions of the electric circuit) in electrical connection with the first measurement point 101. As an example, the first measurement point 101 may be located at a primary electric line 101A of the electric circuit, which receives input AC power from a suitable electric power source, while the second measurements points 102 may be located at secondary electric lines 102A feeding suitable electric loads or electrically connected to a further section of the electric circuit.

According to the present disclosure, the measuring apparatus 1 includes a first measuring unit 10 operatively coupled to the first measurement point 101 of the electric circuit.

The first measuring unit 10 is configured to acquire and store first detection values $v(t)=[v_1(t), v_2(t), v_3(t)]$ related to one or more instantaneous voltages at the first measurement point 101.

The acquired first detection values $v(t)$ may be indicative of one or more phase-to-phase instantaneous voltages or one or more phase-to-neutral instantaneous voltages.

The acquired first detection values $v(t)$ may be indicative of one or more instantaneous voltages (e.g., one for each electric phase). In this case, they may be represented as a vector $v(t)=[v_1(t), v_2(t), v_3(t)]$.

The acquired first detection values $v(t)$ are conveniently formed by digital samples of the waveforms of the aforesaid instantaneous voltages at the first measurement point 101.

The first measuring unit 10 may be a self-standing unit or be installed onboard another device of the electric circuit, for example a switching device.

The first measuring unit 10 may include voltage sensing means (not shown) configured to sense one or more phase-to-phase instantaneous voltages or one or more phase-to-neutral voltages, at the first measurement point 101.

The first measuring unit 10 may include first sampling means (not shown) operatively coupled to the above-mentioned sensing means to collect digital samples of the waveforms of the detected voltages. The aforesaid first sampling means operate with a suitable sampling frequency, which may be in the order of some kHz, for example included in the range of 4-8 kHz. According to some embodiments of the present disclosure, the first measuring unit 10 may be configured to acquire detection values related to one or more additional physical quantities of the electric circuit, at the first measurement point 101.

Such further detection values may include, for example, RMS current values, peak current values, RMS voltage values, peak voltage values, active or reactive power values, detection values indicative of a current harmonic content, detection values indicative of a voltage harmonic content, temperature values, humidity values, and the like.

In order to acquire these additional detection values, the first measuring unit 10 may include first additional sensing means (not shown) operatively coupled to the above-mentioned digital sampling means to collect digital samples of these additional physical quantities.

The first measuring unit 10 may include suitable first storage means (not shown) configured to store the acquired detection values and suitable first control means (FIG. 2, reference number 13) to manage the general operation of the measuring unit.

In general, the above-mentioned voltage sensing means, first sampling means, first additional sensing means, first storage means and first control means may be arranged according to solutions of known type and are not here described in further details for the sake of brevity.

According to the present disclosure, the measuring apparatus 1 includes a plurality of second measuring units 20 operatively coupled to a plurality of second measurement points 102 of the electric circuit.

Each second measuring unit 20 is configured to acquire and store second detection values $i(t)$ related to one or more instantaneous currents at a corresponding second measurement point 102.

The acquired second detection values $i(t)$ may be indicative of a single instantaneous current out of all the electric phases. In this case, the second detection values may be represented as a vector $i(t)=[i(t)]$. Alternatively, the acquired second detection values $i(t)$ may be indicative of a plurality of instantaneous currents (e.g., one for each electric phase). In this case, the second detection values may be represented as a vector $i(t)=[i_1(t), i_2(t), i_3(t)]$.

The acquired second detection values $i(t)$ are conveniently formed by digital samples of the waveforms of the aforesaid instantaneous currents at the corresponding second measurement point 102.

Each second measuring unit 20 may include or is operatively coupled to current sensing means (not shown) configured to sense one or more instantaneous currents at the corresponding second measurement point 102.

Each second measuring unit 20 may include second sampling means (not shown) operatively coupled to the above-mentioned sensing means to collect digital samples of the waveforms of the detected currents with a suitable sampling frequency (e.g., 4-8 kHz).

As it will better emerge from the following, the second sampling means of each second measuring unit 20 are triggered in response to receiving a broadcast message coming from the first measuring unit 10. The sampling means of the first measuring unit 10 and of each second measuring unit 20 thus naturally operate with the same sampling frequency of the first sampling means of the first measuring unit 10.

According to some embodiments of the present disclosure, each second measuring unit 20 may be configured to acquire and store additional detection values S(t) related to one or more additional physical quantities of the electric circuit, at the corresponding second measurement point 102.

Such further detection values may include RMS current values, peak current values, RMS voltage values, peak voltage values, temperature values, humidity values, and the like.

In order to acquire these additional detection values, each second measuring unit 102 includes or is operatively coupled to second additional sensing means (not shown) operatively coupled to the above-mentioned second sampling means to collect digital samples of these additional physical quantities.

Each second measuring unit 20 may include suitable second storage means (not shown) configured to store the acquired detection values and the received broadcast messages and suitable second control means (not shown) to manage the general operation of the measuring unit.

In general, the above-mentioned current sensing means, second sampling means, second additional sensing means, second storage means and second control means may be arranged according to solutions of known type and are not here described in further details for the sake of brevity.

According to the present disclosure, the first measuring unit 10 and the second measuring units 20 are capable of communicating one with another.

As shown in FIG. 1, the measuring units 10, 20 may communicate in a wired manner. In this case, the measuring apparatus 1 advantageously includes a communication bus 30, for example a RS-485 bus, which operatively couples the measuring units 10, 20.

However, according to some embodiments of the present disclosure, the communication between the measuring units 10, 20 may occur in a wireless manner through suitable communication channels, for example Wi-Fi™, Bluetooth or Zigbee™ communication channels.

According to the present disclosure, the first measuring unit 10 is configured to transmit cyclically a broadcast message $M_B$ to the second measuring units 20.

The first measuring unit 10 transmits the broadcast messages $M_B$ with a predefined broadcasting frequency $f_B$, at subsequent measurement intervals having a predefined duration.

The broadcasting frequency $f_B$ (with which the broadcast messages $M_B$ are transmitted) may be in the order of some kHz, for example included in the range of 4-8 kHz.

The duration $T_D$ of the measurement intervals obviously depends on the broadcasting frequency $f_B$. As an example, the duration $T_D$ of each measurement interval is of 0.125 ms for a broadcasting frequency of 8 kHz.

The broadcasting frequency $f_B$ may coincide with the sampling frequency of the detected physical quantities, so that the transmission of the broadcast messages $M_B$ by the first measuring unit is synchronous with the detection of the instantaneous voltages (and possibly of the first additional physical quantities) by the same first measuring unit 10 and with the detection of the instantaneous currents (and possibly of the second additional physical quantities) by the second measuring units 20. As it will better emerge from the following, this solution advantageously allows carrying out real-time measurements (i.e., measurements with a relatively short latency time) of the active electric power flowing through the second measurement points.

According to some embodiments of the present disclosure, however, the broadcasting frequency $f_B$ can be lower than the sampling frequency of the detected physical quantities, for example 4 kHz if the sampling frequency is 8 kHz.

Each broadcast message $M_B$ includes first detection values v(t) acquired by the first measuring unit 10 and also may include an address value A addressing a second measuring unit 20, from which a response message $M_R$ is desired.

The address value A may be indicative of the logical address or the network address of a second measuring unit 20.

Figure 4:
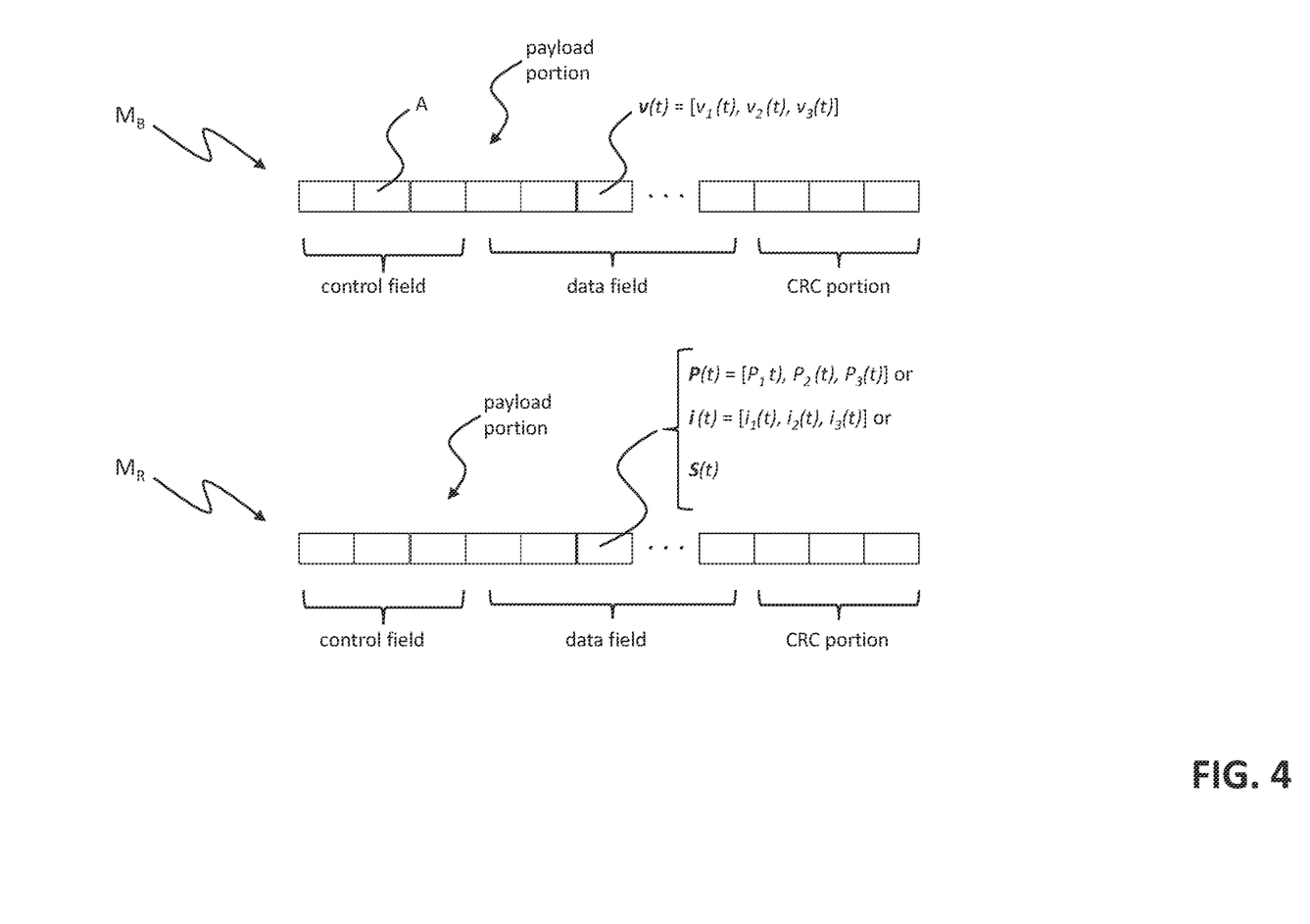

FIG. 4 shows an example of broadcast message $M_B$ transmitted by the measuring unit 10.

As foreseen in many communication protocols, the broadcast message $M_B$ includes a payload portion and a CRC (Cyclic Redundancy Check) portion. The payload portion includes a control field, which includes the address value A of a second measuring unit 20 and a data field including the first detection values v(t)=[$v_1$(t), $v_2$(t), $v_3$(t)] acquired by the first measuring unit 10.

As mentioned above, the transmission of the broadcast messages $M_B$ may be carried out synchronously with the acquisition process of the first detection values v(t). In this case, the first detection values v(t) of each broadcast message $M_B$ will include a single digital sample of the waveform of each detected instantaneous voltage. Similarly, the second detection values i(t), acquired by each second measuring unit 20, will include a single digital sample of the waveform of each detected instantaneous current.

If the broadcasting frequency $f_B$ is lower than the sampling frequency of the first measuring unit 10, the first detection values v(t) of each broadcast message $M_B$ will include a collection of digital samples of the waveform of each detected instantaneous voltage while the second detection values i(t), acquired by each second measuring unit 20, will include a collection of digital samples of the waveform of each detected instantaneous current.

According to the present disclosure, each second measuring unit 20 is configured to receive, during each generic measurement interval $T_J$, a broadcast message $M_{B,J}$ transmitted by the first measuring unit 10 during the same measurement interval $T_J$.

The broadcast message $M_{B,J}$ transmitted by the first measuring unit 10 and received by each second measuring unit 20, during each measurement interval $T_J$, includes first detection values v(t) acquired by the first measuring unit 10 at an acquisition instant $t_K$ preceding the above-mentioned measurement interval $T_J$.

The transmission/reception mechanism of the broadcast messages $M_B$ is better explained with reference to FIG. 3.

The first measuring unit 10 is supposed to transmit a broadcast message $M_{B,J}$ during a generic measurement interval $T_J$.

The transmitted broadcast message $M_{B,J}$ includes first detection values v(t) acquired by the first measuring unit 10 at a given acquisition instant $t_K$ preceding the measurement interval $T_J$.

Figure 3:
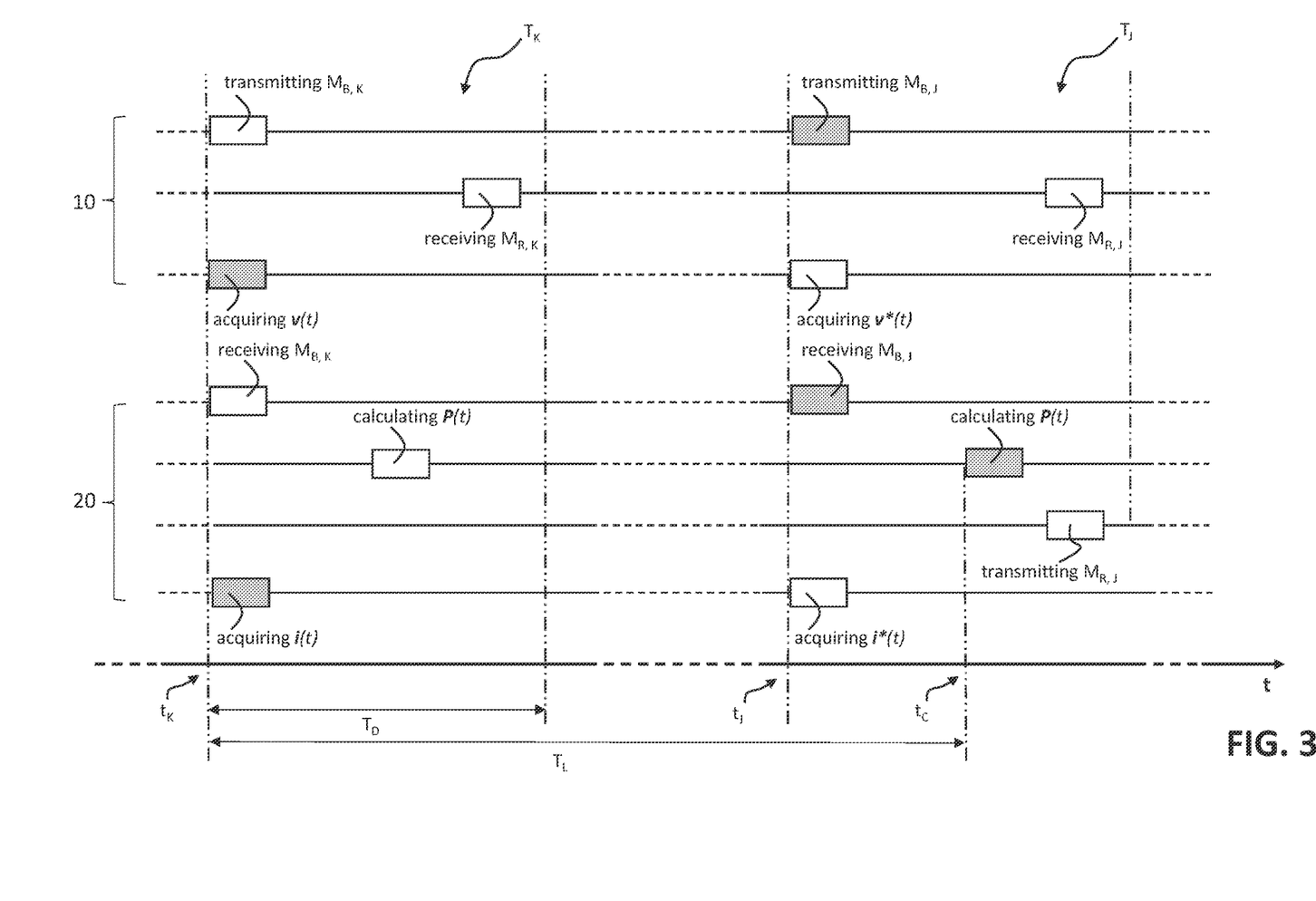
FIGS. 3-5 schematically show the operation of the measuring apparatus, according to the present disclosure.

As shown in FIG. 3, the acquisition instant $t_K$ of the first detection values v(t) may coincide with the starting instant of a certain measurement interval $T_K$ preceding the measurement interval $T_J$ and spaced a certain time apart from this latter.

This situation is rather reasonable as the acquisition instant may be actually taken as a reference instant for starting the measurement interval $T_K$ or it may be actually spaced a negligible time apart from the actual starting instant of the measurement interval $T_K$.

For the sake of simplicity, the operation of measuring apparatus 1 will be described hereinafter with reference to the situation in which the acquisition instant $t_K$ of the first detection values v(t) coincides with the starting instant of a certain measurement interval $T_K$, as shown in FIG. 3. This choice does not intend to limit the scope of the present disclosure. As a matter of fact, in principle, the acquisition instant $t_K$ of the first detection values v(t) may differ from the starting instant of the measurement interval $T_K$ and it may be spaced a measurable time apart from this latter.

A generic second measuring unit 20 receives, during the above-mentioned generic measurement interval $T_J$, the broadcast message $M_{B,J}$ transmitted by the first measuring unit 10. The reception of the broadcast message $M_{B,J}$ by each second measuring unit 20 occurs with a negligible time delay with respect to the transmission of said broadcast message by the first measuring unit 10.

According to the present disclosure, each second measuring unit 20 is configured to calculate, during the above-mentioned generic measurement interval $T_J$ and in response to receiving the broadcast message $M_{B,J}$, third detection values P(t) indicative of the active electric power flowing through the second measurement point 102 of the electric circuit, which corresponds to said second measuring unit.

The measured third detection values P(t) may be indicative of a sum of the active power measured for all the electric phases. In this case, the third detection values may be represented as a vector P(t)=[P(t)]. Alternatively, the measured third detection values P(t) may be indicative of the active power for each electric phase. In this case, the third detection values may be represented as a vector P(t)=[$P_1$(t), $P_2$(t), $P_3$(t)].

According to the present disclosure, each second measuring unit 20 is configured to calculate the third detection values P(t) at a calculation instant $t_C$, which is included in the measurement interval $T_J$ in which the broadcast message $M_{B,J}$ is received.

The calculation instant $t_C$ is delayed by a predefined latency time $T_L$ relative to the acquisition instant $t_K$ of the first detection values v(t) included in the broadcast message $M_{B,J}$ received by the second measuring unit 20.

The latency time $T_L$ is substantially a time delay due to the intrinsic latency of the electronic components of the first measuring unit 10 and of the second measuring unit 20. In other words, the latency time $T_L$ can be substantially defined as:

$$T_L = T_{L1} + T_{L2}$$

wherein $T_{L1}$ is the time delay introduced by the electronics of the first measuring unit 10 (e.g., for acquiring the first detection values v(t) and encoding them in a broadcast message $M_{B,J}$ to be transmitted to the second measuring units 20) and $T_{L2}$ is the time delay introduced by the electronics of each second measuring unit 20 (e.g., for decoding the received broadcast message $M_{B,J}$ and storing the first detection values v(t) included in said broadcast message).

In general, the latency time $T_L$ depends on the physical characteristics of the electronics of the first measuring unit 10 and of the second measuring units 20.

The predefined latency time $T_L$ may be constant and equal for all the second measuring units 20.

The predefined latency time $T_L$ may be an integer multiple of the duration $T_D$ of each measurement interval $T_J$, $T_K$. As an example, if the measurement intervals have a duration of 0.125 ms, the latency time may be $T_L = 35 * T_D = 4.125$ ms.

Conveniently, each second measuring unit 20 is configured to store a predefined time value indicative of the latency time $T_L$. As it will better explained in the following, this stored time value is used by each second measuring unit 20 to calculate the acquisition instant $t_K$ of the first detection values v(t) included in a received broadcast message $M_{B,J}$.

According to the present disclosure, each second measuring unit 20 is configured to calculate the third detection values P(t) based on first detection values v(t) received by the second measuring unit 20 up to the calculation instant $t_C$ and based on second detection values i(t) acquired by the second measuring unit 20 up to the acquisition instant $t_K$ of the first detection values v(t) included in the received broadcast message $M_{B,J}$.

Referring to a generic measurement interval $T_J$ in which a broadcast message $M_{B,J}$ is received, the first detection values v(t) selected for the calculation of the third detection values P(t) are those received (through a number of different broadcast messages received during a number of subsequent measurement intervals) during a predefined period of time T up to the calculation instant $t_C$ of the active power included in the measurement interval $T_J$ taken into consideration.

Accordingly, the second calculation values i(t) selected for the calculation of the third detection values P(t) are those acquired during a same predefined period of time T up to the acquisition instant $t_K$ of the first detection values v(t) included in the broadcast message $M_B$ in the measurement interval $T_J$.

The predefined period of time T used to calculate the third detection values P(t) may be calculated depending on the mains frequency. An example, if the mains frequency is $f_M = 50$ Hz, the above-mentioned predefined period of time is $T = 1/f_M = 20$ ms.

Each second measuring unit 20 is configured to calculate the acquisition instant $t_K$ of first detection values v(t) included in the broadcast message $M_{B,J}$ received during the measurement interval $T_J$ based on the calculation instant $t_C$ of the active power and based on the predefined latency time $T_L$ relative to said acquisition instant.

Figure 5:
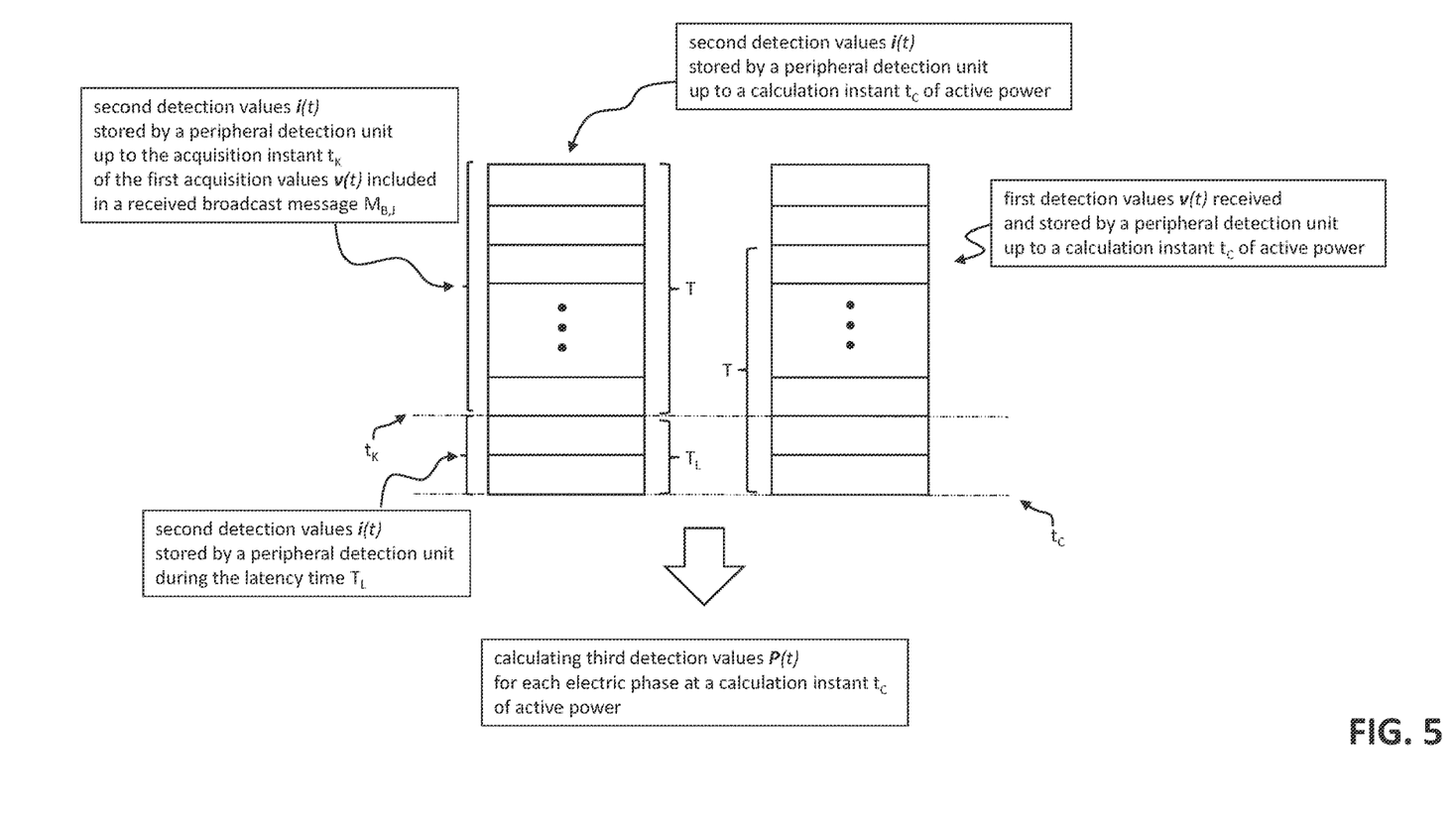

The calculation mechanism of the third detection values P(t), carried out by a generic second measuring unit 20, is briefly explained in the following with reference to FIGS. 3 and 5.

As illustrated above, the second measuring unit 20 continuously stores the first detection values v(t) received from the first measuring unit 10 and the acquired second detection values i(t).

In response to receiving a broadcast message $M_{B,J}$ at a generic measurement interval $T_J$, the second measuring unit 20 selects the first detection values v(t) received by said second measuring unit during a predefined period of time T up to the calculation instant $t_C$ of said broadcast message.

The selected first detection values {$v_J(t), v_{J-1}(t), \ldots, v_{J-N+1}(t)$} include the first detection values $v_J(t)$ received by the second measuring unit 20 during the measurement interval $T_J$ and the first detection values $v_{J-1}(t), \ldots, v_{J-N+1}(t)$ received by the second measuring unit 20 during N−1 measurement intervals $T_{J-1}, \ldots, T_{J-N+1}$ preceding the measurement interval $T_J$, with N=T/$T_D$, where $T_D$ is the duration of each measurement interval. Obviously, the first detection values $v_{J-1}(t), \ldots, v_{J-N+1}(t)$ are included in corresponding N−1 different broadcast messages transmitted by the first measuring unit 10 and received by the second measuring unit 20 during N−1 measurement intervals $T_{J-1}, \ldots, T_{J-N+1}$ preceding the measurement interval $T_J$.

In response to receiving the broadcast message $M_{B,J}$ at the same measurement interval $T_J$, the second measuring unit 20 further selects the second detection values i(t) acquired by said second measuring unit during a period of time corresponding to the above-mentioned predefined period of time T up to the calculation instant $t_C$ of the active power.

The selected second detection values $\{i_K(t), i_{K-1}(t), \ldots, i_{K-N+1}(t)\}$ include the second detection values $i_K(t)$ acquired by the second measuring unit 20 during the measurement interval $T_K$ including the acquisition instant $t_K$ of the first detection values v(t) included in the broadcast message $M_B$ in the measurement interval $T_J$ and the second detection values $i_{K-1}(t), \ldots, i_{K-N+1}(t)$ acquired by the second measuring unit 20 during N−1 measurement intervals $T_{K-1}, \ldots, T_{K-N+1}$ preceding the measurement interval $T_K$, with $N=T/T_D$, where $T_D$ is the duration of each measurement interval. In other words, the selected second detection values $\{i_K(t), i_{K-1}(t), \ldots, i_{K-N+1}(t)\}$ include the second detection values $i_K(t)$ acquired by the second measuring unit 20 at the acquisition instant $t_K$ and at a sequence of acquisition instants $t_{K-1}, \ldots, t_{K-N+1}$ (with $N=T/T_D$) preceding the acquisition instant $t_K$.

The second measuring unit 20 does not explicitly know the actual acquisition instant $t_K$ of the first detection values v(t) included in the broadcast message $M_{B,J}$ received at the measurement interval $T_J$ taken into consideration since the received broadcast message does not include timestamps indicative of said acquisition instant.

However, the second measuring unit 20 can calculate such an acquisition instant based on the following relation: $t_K=t_C−T_L$, where $T_L$ is the latency time of the received broadcast message and $t_C$ is the calculation instant of the active power during the measurement interval $T_J$ (obviously the calculation instant $t_C$ is per se known).

In view of the above, it is apparent that the selected first detection values $\{v_J(t), v_{J-1}(t), \ldots, v_{J-N+1}(t)\}$ are the last first detection values received and stored by the second measuring unit 20 up to the calculation instant $t_C$ of the active power included in the measurement interval $T_J$, in which the last broadcast message $M_{B,J}$ is received.

Instead, the selected second detection values $\{i_K(t), i_{K-1}(t), \ldots, i_{K-N+1}(t)\}$ are the last second detection values acquired and stored by the second measuring unit 20 up to the acquisition instant $t_K$ of the first detection values v(t) received with the last broadcast message $M_{B,J}$.

The selected first detection values $\{v_J(t), v_{J-1}(t), \ldots, v_{J-N+1}(t)\}$ and second detection values $\{i_K(t), i_{K-1}(t), \ldots, i_{K-N+1}(t)\}$ thus refer to a same measurement interval $T_K$, during which they have been acquired by the first measuring unit 10 and the second measuring unit 20, respectively (see FIG. 3—blocks represented in grey in measurement interval $T_K$). These detection values are then processed during another subsequent measurement interval $T_J$ to calculate active power (see FIG. 3—blocks represented in grey in measurement interval $T_J$).

Based on the selected first detection values $\{v_J(t), v_{J-1}(t), \ldots, v_{J-N+1}(T)\}$ and the selected second detection values $\{i_K(t), i_{K-1}(t), \ldots, i_{K-N+1}(t)\}$ the second measuring unit 20 calculates the third detection values P(t).

The second measuring unit 20 conveniently calculates the third detection values P(t) at the calculation instant $t_C$ included in the calculation instant $T_J$, in which the last broadcast message $M_{B,J}$ is received. For one or more electric phases, the calculation of the active power can be based on the following relation:

$$P(t) = \frac{1}{T} \int_{t_{M-T}}^{t_M} v(t)i(t)dt$$

where i(t) and v(t) are values included in the above-mentioned selected first and second detection values and T is the predefined period of time taken into consideration for selecting the above-mentioned first and second detection values.

Obviously, the integral operator appearing in the computation of third detection values P(t) is numerically approximated on the basis of the discrete sets of first and second detection values, according to discretization methods well-known to those skilled in the art.

It is evidenced that, at the starting instant $t_J$ of the measurement interval $T_J$, the first measuring unit acquires first detection values v*(t) that will be included in a future broadcast message (not shown in FIG. 3) of said first measuring unit and will be used in future calculations of the active power.

During the measurement interval $T_J$, in response to receiving the broadcast message $M_{B,J}$ and with a negligible delay with respect to starting instant $t_J$, the second measuring unit 20 acquires second detection values i*(t) that will be used in future calculations of the active power.

As mentioned above, each broadcast message $M_B$ transmitted by the first measuring unit 10 may include an address value A indicative of a certain second measuring unit 20.

In this case, each second measuring unit 20 may be configured to transmit, in response to receiving a broadcast message $M_B$ at a measurement interval, a response message $M_R$ to the first measuring unit 10, if said second measuring unit is pointed by the address value A included in the received broadcast message $M_B$.

The response message $M_R$ may include one or more detection values calculated or detected by the second measuring unit 20 addressed by the received broadcast message $M_B$.

The response message $M_R$ of an addressed second measuring unit 20 may include third detection values P(t) calculated by said second measuring unit.

As an alternative, the response message $M_R$ of an addressed second measuring unit 20 may include second detection values i(t) detected by said second measuring unit.

As a further alternative, the response message $M_R$ of an addressed second measuring unit 20 may include possible additional detection values S(t) detected by said second measuring unit.

FIG. 3 schematically illustrates the transmission mechanism of a response message by a generic second measuring unit 20.

Referring to FIG. 3, the second measuring unit 20 receives, at a generic measurement interval $T_K$, a broadcast message $M_{B,K}$ transmitted by the first measuring unit 10. In this case, the address value A of the broadcast message $M_{B,K}$ does not address the second measuring unit 20. This latter thus calculates the third detection values P(t) according to the calculation mechanism illustrated above but it does not transmit any response message to the first measuring unit 10.

This latter, however, will receive a response message $M_{R,K}$ from another second measuring unit different from the second measuring unit 20 taken into consideration.

At another generic measurement interval $T_J$, the second measuring unit 20 receives a broadcast message $M_{B,J}$ addressing said second measuring unit. In this case, the second measuring unit 20 calculates the third detection values P(t) and transmits a suitable response message $M_{R,J}$ to the first measuring unit 10. The first measuring unit 10 will receive the response message $M_{R,J}$ transmitted by the second measuring unit 20 taken into consideration.

In view of the above, it is important to notice that each second measuring unit 20 continuously calculates the third detection values P(t) even if it is not addressed by the broadcast messages coming from the first measuring unit 10.

The first measuring unit 10 may be configured to poll (i.e. to address through a suitable address value A) each second measuring unit 20 cyclically, with a polling frequency that depends on the broadcasting frequency $f_B$ and on the overall number of second measuring units. As an example, the polling frequency $f_P$ of a generic second measuring unit 20 can be calculated based on the following relation $f_P=f_B/S$, where $f_B$ is the broadcasting frequency and S is the overall number of second measurement points 102.

FIG. 4 shows an example of response message $M_R$ transmitted by a generic second measuring unit 20. Also in this case, the response message $M_R$ may include a payload portion and a CRC portion. The payload portion includes a data field including detection values acquired or calculated by the second measuring unit 20.

The transmission of the response messages $M_R$ may be carried out synchronously with the acquisition or calculation process of detection values by each second measuring unit 20.

In this case, a response message $M_R$ includes detection values acquired or calculated by a second measuring unit 20 at the same corresponding measurement interval during which the broadcast message $M_B$ is transmitted.

Figure 2:
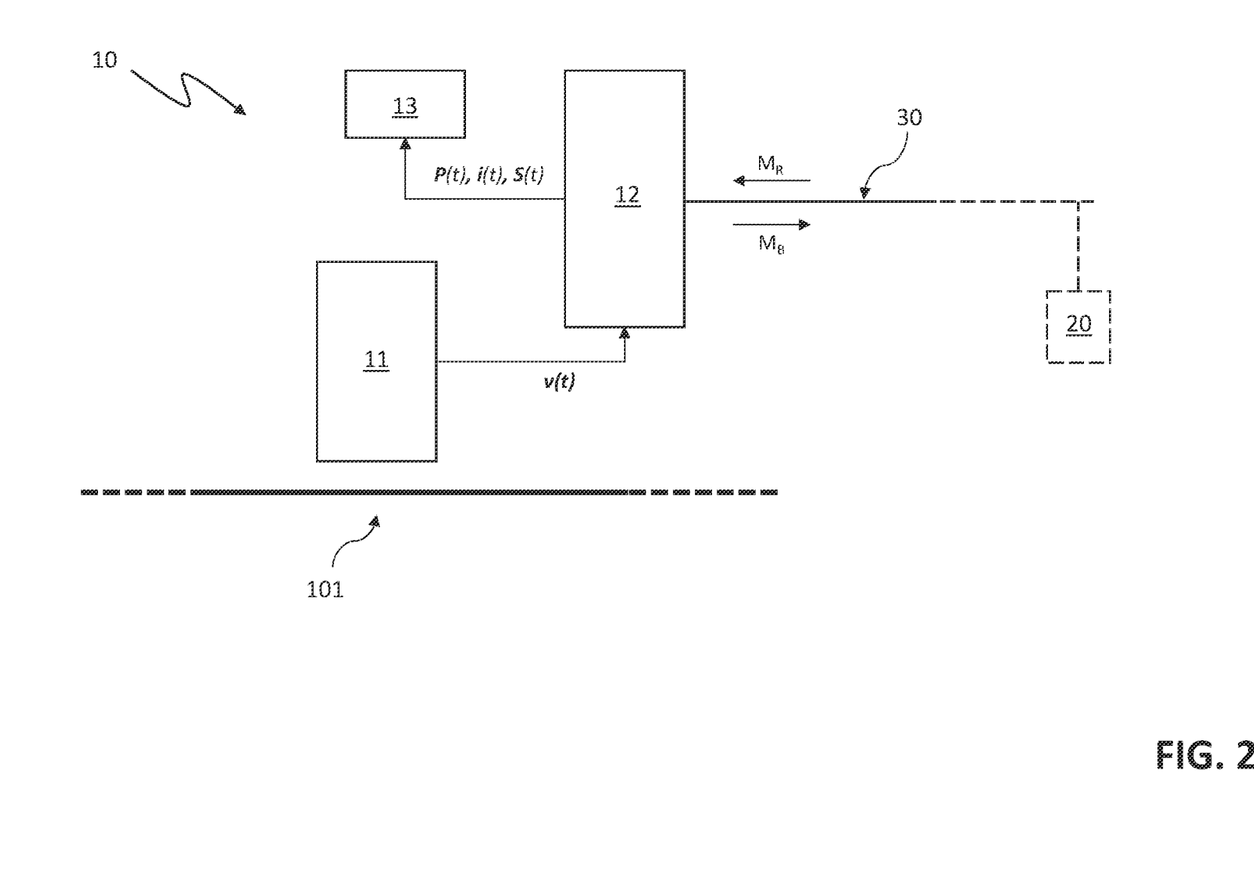
FIG. 2 schematically shows a measuring unit of the measuring apparatus, according to an embodiment of the present disclosure.

FIG. 2 schematically shows the internal structure of the first measuring unit 10, according to some embodiments of the present disclosure.

The first measuring unit 10 includes a metering module 11 configured to sense one or more instantaneous voltages at the first measurement point 101 of the electric circuit.

The metering module 11 includes voltage sensing means to detect voltages (e.g., phase-to-phase instantaneous voltages or phase-to-neutral instantaneous voltages) at the first measurement point 101 and, possibly, further sensing means to detect additional physical quantities as mentioned above.

The metering module 11 further includes sampling means operatively coupled to the above-mentioned sensing means to collect digital samples of the detected physical quantities.

The first measuring unit 10 further includes a broadcasting module 12 configured to transmit the broadcast messages MB to the second measuring units 20.

Conveniently, the metering module 11 and the broadcasting module 12 are capable of communicating one with another, and may be capable of communicating one with another through an internal communication bus or a communication interface.

The broadcasting module 12 is additionally capable of communicating with the second measuring units 20 in a wired or wireless manner, as explained above.

The first measuring unit 10 further includes a control module 13 configured to control and coordinate the operation of the above-mentioned metering module and broadcasting module. and suitable storage means (not shown), which may be distributed at level of the above-mentioned metering module and/or the broadcasting module and/or the control module.

According to these embodiments of the present disclosure, the metering module 11 is configured to acquire the above-mentioned first detection values v(t) and transmit said first detection values to the broadcasting module 12.

The broadcasting module 12 is configured to encode the received first detection values v(t) in a broadcast message $M_B$ and transmit said broadcast message to the second measuring units 20.

The above-mentioned encoding task is carried out cyclically, with a predefined broadcasting frequency coinciding with the sampling frequency of the sampling means.

When the sampling frequency of the sampling means coincides with the broadcasting frequency $f_B$, as illustrated above, the above-mentioned encoding task is carried out at subsequent measurement intervals.

The broadcasting module 12 may be configured to receive the response messages $M_R$ transmitted by the second measuring units 20 addressed by the transmitted broadcast messages.

In this case, during each measurement time interval, the broadcasting module 12 is configured to decode the detection values P(t), i(t) or S(t) included in each received response message $M_R$ and transmit said detection values to the control module 13.

The broadcasting module 12 may be configured to interact with the control module 13 synchronously with the broadcasting frequency $f_B$. In this case, the broadcasting module 12 transmits or receives the above-mentioned detection values during each measurement interval.

In a further aspect, the present disclosure relates to a measuring method for measuring active electric power in an electric circuit 100.

The method of the present disclosure includes the step of acquiring first detection values v(t) related to one or more voltages at the first measurement point 101 of the electric circuit. As illustrated above, in the measuring apparatus 1, this step of the method of the present disclosure is carried out by the first measuring unit 10.

The method of the present disclosure includes the step of acquiring second detection values i(t) related to one or more currents at the second measurement points 102 of the electric circuit. As illustrated above, in the measuring apparatus 1, this step of the method of the present disclosure is carried out by the second measuring units 20.

The method of the present disclosure includes the step of transmitting, at the first measurement point 101, broadcast messages $M_B$ to the second measurement points 20. The transmission of the broadcast messages $M_B$ occurs in a cyclical manner, with a predefined broadcasting frequency $f_B$ and during subsequent measurement intervals. Each broadcast message $M_B$ includes first detection values v(t) acquired at the first measurement point 101. As illustrated above, in the measuring apparatus 1, this step of the method of the present disclosure is carried out by the first measuring unit 10.

The method of the present disclosure includes the step of receiving, at each second measurement point 102 and during each generic measurement interval $T_J$, a broadcast message $M_B$ transmitted from the first measuring point 101 and including the first detection values v(t) acquired at the first measurement point 101 at an acquisition instant $(t_K)$ preceding the measurement interval $T_J$.

As illustrated above, in the measuring apparatus of the present disclosure, this step of the method of the present disclosure is carried out by each second measuring unit 20.

The method of the present disclosure includes the step of calculating, at each second measurement point 102, in response to receiving a broadcast message $M_{B,J}$ during a given measurement interval $T_J$, third detection values P(t) indicative of the active electric power flowing through said second measurement point.

As illustrated above, in the measuring apparatus of the present disclosure, this step of the method of the present disclosure is carried out by each second measuring unit 20.

According to the present disclosure, the third detection values P(t) are calculated at a calculation instant $t_C$ included in the measurement interval $T_J$ during which the broadcast message $M_{B,J}$ is received. The calculation instant $t_C$ is delayed by a predefined latency time $T_L$ relative to the acquisition instant $t_K$ of the first detection values v(t) included in the received broadcast message $M_{B,J}$.

According to the present disclosure, the third detection values P(t) are calculated based on first detection values v(t) received at the second measurement point 102 up to the calculation instant $t_C$ and based on second detection values i(t) acquired at the second measurement point 102 up to the acquisition instant $t_K$ of the first detection values v(t) included in the received broadcast message $M_{B,J}$.

According to the present disclosure, the acquisition instant $t_K$ of the first detection values v(t), included in the received broadcast message $M_{B,J}$, is calculated based on the calculation instant $t_C$ and based on the latency time $T_L$.

The predefined latency time TL may have a constant and equal duration for all the second measurement points 102.

The predefined latency time $T_L$ may have a duration that is an integer multiple of the duration of each measurement interval, in which the broadcast message is transmitted.

According to some embodiments, the method of the present disclosure includes the step of acquiring, at each second measurement point 102, additional detection values S(t) related to one or more additional physical quantities. As illustrated above, these further detection values may include RMS current values, peak current values, RMS voltage values, peak voltage values, temperature values, humidity values, and the like.

Each broadcast message $M_B$ may also include an address value A indicative of a second measurement point 102, from which a response message $M_R$ is desired. As illustrated above, the address value A may address a measuring unit operatively associated with the second measurement point 102.

The method of the present disclosure may include the step of transmitting, at an indicated second measurement point 102, in response to receiving a broadcast message $M_B$, during a measurement interval, a response message $M_R$ to the first measurement point 101.

The response message $M_R$ includes detection values calculated or detected at the second measurement point 102. More particularly, the response message $M_R$ includes one or more detection values selected among third detection values P(t) calculated at the second measurement point 102 or second detection values i(t) acquired at the second measurement point 102 or additional detection values S(t) acquired at the second measurement point 102.

The measurement apparatus and method according to the present disclosure, are quite effective in solving or mitigating the above-evidenced drawbacks of the state of the art.

The measuring apparatus and method of the present disclosure allow directly measuring the active electric power, which is flowing through a given second (peripheral) measurement point of the electric circuit, based on instantaneous currents detected at said second measurement point and on instantaneous voltages detected at a first (central) measurement point.

This solution allows remarkably improving the measurement accuracy of the active electric power at the second (peripheral) measurement points. As a matter of fact, the active electric power is calculated based on the waveforms of the detected instantaneous currents and voltages and not on measured RMS values of said currents and voltages. Therefore, phase-shift measurements or power factor estimations of the electric circuit at the second (peripheral) measurement points are no longer needed.

According to the present disclosure, thanks to the above-illustrated transmission/reception mechanism of broadcast messages $M_B$ from the first measuring unit 10 towards all the second measuring units 20, the detection values v(t), i(t) used to calculate active power P(t) are naturally synchronized without the need of transmitting timestamps between the first measuring unit 10 and the second measuring units 20. This allows remarkably reducing the amount of data exchanged between the first measuring unit 10 and the second measuring units 20.

The measurement apparatus and method, according to the present disclosure, allow carrying out real-time measurements of the active electric power at a high number of measurement points. They are characterized by a high flexibility in use and they can be easily adapted to any type of electric circuit.

The measurement apparatus and method according to the present disclosure do not need relatively complex sensing means and highly performant processing resources for their practical implementation. They are therefore relatively easy and simple to arrange at industrial level at competitive costs compared to the measurement apparatuses of the state of the art.

The invention claimed is:

1. A measuring apparatus for measuring active electric power in an electric circuit, said measuring apparatus comprising:
   a first measuring unit operatively coupled to a first measurement point of said electric circuit, said first measuring unit configured to acquire first detection values (v(t)) related to one or more voltages at the first measurement point of said electric circuit; and
   a plurality of second measuring units operatively coupled to a plurality of second measurement points of said electric circuit, each second measuring unit of the plurality of second measuring units configured to acquire second detection values (i(t)) related to one or more currents at a corresponding second measurement point of said electric circuit,
   wherein said first measuring unit and said second measuring units are capable of communicating one with another,
   wherein said first measuring unit is configured to transmit in a cyclical manner, with a predefined broadcasting frequency and during subsequent measurement intervals (TJ), broadcast messages (MB) to said second measuring units, each broadcast message (MB) including the first detection values (v(t)) acquired by said first measuring unit,
   wherein each second measuring unit is configured to receive, during each measurement interval (TJ), a broadcast message (MB,J) of the broadcast messages (MB) transmitted by said first measuring unit that includes first detection values (v(t)) acquired by said first measuring unit at an acquisition instant (tK) preceding said measurement interval (TJ),
   wherein each second measuring unit is configured to calculate, during said measurement interval (TJ), in response to receiving said broadcast message (MB,J), third detection values (P(t)) indicative of active electric power flowing through the corresponding second measurement point of said electric circuit, wherein each second measuring unit is configured to calculate said third detection values (P(t)) at a calculation instant (tC) included in said measurement interval (TJ) and delayed by a predefined latency time (TL) relative to the acquisition instant (tK) of the first detection values (v(t)) included in the received broadcast message (MB,J), wherein each second measuring unit is configured to calculate said third detection values (P(t)) based on the first detection values (v(t)) received by said second measuring unit up to said calculation instant (tC) and based on the second detection values (i(t)) acquired by said second measuring unit up to the acquisition instant (tK) of the first detection values (v(t)) included in the received broadcast message (MB,J), and wherein each second measuring unit is configured to calculate the acquisition instant (tK) of the first detection values (v(t)) included in the received broadcast message (MB,J) based on said calculation instant (tC) and said predefined latency time (TL).

2. The measuring apparatus according to claim 1, wherein said predefined latency time (TL) has a constant and equal duration for all the second measuring units.

3. The measuring apparatus according to claim 2, wherein said predefined latency time (TL) is an integer multiple of a duration time (TD) of each measurement interval (TJ).

4. The measuring apparatus according to claim 1, wherein each second measuring unit is configured to acquire additional detection values (S(t)) related to one or more additional physical quantities at the corresponding second measurement point of said electric circuit.

5. The measuring apparatus according to claim 1, wherein each broadcast message (MB) includes an address value (A) addressing one second measuring unit of the plurality of second measuring units, from which a response message (MR,J) is desired.

6. The measuring apparatus according to claim 5, wherein each second measuring unit is configured to transmit, during said measurement interval (TJ), in response to receiving said broadcast message (MB,J), the response message (MR,J) to said first measuring unit, if said second measuring unit is addressed by the address value (A) included in the received broadcast message (MB,J), said response message (MR,J) including one or more detection values (P(t), i(t), S(t)) calculated or detected by the corresponding second measuring unit.

7. The measuring apparatus according to claim 1, wherein said first measuring unit comprises:
a metering module configured to sense one or more voltages at the first measurement point of said electric circuit;
a broadcasting module configured to transmit said broadcast messages (MB) to said second measuring units; and
a control module configured to control operation of said metering module and said broadcasting module,
wherein said metering module is configured to acquire said first detection values (v(t)) and transmit said first detection values to said broadcasting module, and
wherein said broadcasting module is configured to encode, during each measurement interval (TJ), said first detection values (v(t)) in the broadcast message (MB) and transmit said broadcast message (MB) to said second measuring units.

8. The measuring apparatus according to claim 7, wherein said broadcasting module is configured to decode, during each measurement interval (TJ), detection values (P(t), i(t), S(t)) included in a response message (MR) received from one second measuring unit of the plurality of second measuring units and transmit said detection values (P(t), i(t), S(t)) to said control module.

9. An electric power distribution system including an electric circuit and the measuring apparatus according to claim 1.

10. A method for measuring active electric power in an electric circuit comprising:
acquiring, by a first computing device operatively coupled to a first measurement point of said electric circuit, first detection values (v(t)) related to one or more voltages at the first measurement point of said electric circuit;
acquiring, by a plurality of second computing devices operatively coupled to a plurality of second measurement points of said electric circuit, second detection values (i(t)) related to one or more currents at the plurality of second measurement points of said electric circuit;
at said first computing device, transmitting in a cyclical manner, with a predefined broadcasting frequency and during subsequent measurement intervals (TJ), broadcast messages (MB) to said second computing devices, each broadcast message (MB) including the first detection values (v(t)) acquired at said first measuring point;
at each second computing device, receiving, during each measurement interval (TJ), a broadcast message (MB, J) of the broadcast messages (MB) transmitted from said first computing device and including the first detection values (v(t)) acquired at said first measuring point by said first computing device at an acquisition instant (tK) preceding said measurement interval (TJ); and
at each second computing device, calculating, in response to receiving said broadcast message (MB,J), third detection values (P(t)) indicative of the active electric power flowing through the corresponding second measurement point of said electric circuit,
wherein said third detection values (P(t)) are calculated at a calculation instant (tC) included in said measurement interval (TJ) and delayed by a predefined latency time (TL) relative to the acquisition instant (tK) of the first detection values (v(t)) included in the received broadcast message (MB,J),
wherein said third detection values (P(t)) are calculated based on the first detection values (v(t)) received at said second measuring point up to said calculation instant (tC) and based on the second detection values (i(t)) acquired at said second measuring point up to the acquisition instant (tK) of the first detection values (v(t)) included in the received broadcast message (MB, J), and
wherein the acquisition instant (tK) of the first detection values (v(t)) included in the received broadcast message (MB,J) is calculated based on said calculation instant (tC) and said predefined latency time (TL).

11. The method according to claim 10, wherein said predefined latency time (TL) has a constant and equal duration for all the second measuring points.

12. The method according to claim 11, wherein said predefined latency time (TL) is an integer multiple of a duration time (TD) of each measurement interval (TJ).

13. The method according to claim 11, further comprising acquiring, at each second measurement point, additional detection values (S(t)) related to one or more additional physical quantities.

14. The method according to claim 11, wherein each broadcast message (MB) includes an address value (A) indicative of one second measuring point of the plurality of second measurement points, from which a response message (MR,J) is desired.

15. The method according to claim 14 further comprising:
- at each second measurement point, transmitting, during said measurement interval (TJ), in response to receiving said broadcast message (MB,J), the response message (MR,J) to said first measuring point, if said second measuring point is indicated by the address value (A) included in said broadcast message (MB,J), said response message (MR,J) including one or more detection values (P(t), i(t), S(t)) calculated or detected at the corresponding second measuring point.

\* \* \* \* \*